United States Patent [19]

Madsen et al.

[11] Patent Number: 5,469,305
[45] Date of Patent: Nov. 21, 1995

[54] AC TIMING ASYMMETRY REDUCTION CIRCUIT INCLUDING SUMMING DC OFFSET VOLTAGE WITH TIMING SIGNAL

[75] Inventors: Timothy A. Madsen; Russell J. Machelski, both of Bloomington, Minn.

[73] Assignee: Seagate Technology, Inc., Scotts Valley, Calif.

[21] Appl. No.: 169,423

[22] Filed: Dec. 17, 1993

[51] Int. Cl.⁶ .................... G11B 5/09; G11B 5/03
[52] U.S. Cl. .................... 360/51; 360/68
[58] Field of Search .................... 360/51, 45, 46, 360/66, 67, 68, 61; 375/76, 110; 307/491, 296.6, 354, 527, 491; 328/123, 162; 455/214; 371/6, 48; 327/362

[56] References Cited

U.S. PATENT DOCUMENTS

| | | | |
|---|---|---|---|
| 3,936,759 | 2/1976 | Macheel | 328/162 |
| 4,510,248 | 5/1985 | Barclay et al. | 375/76 |
| 4,612,586 | 9/1986 | Sordello et al. | 360/45 X |
| 4,625,320 | 11/1986 | Butcher | 375/76 |
| 4,734,900 | 3/1988 | Davie | 360/51 X |
| 4,796,109 | 1/1989 | Sordello et al. | 360/45 |
| 4,829,391 | 5/1989 | Vargas, Jr. | 360/51 |
| 4,873,702 | 10/1989 | Chiu | 375/76 |
| 5,121,085 | 6/1992 | Brown | 360/51 X |
| 5,182,476 | 1/1993 | Hanna et al. | 307/491 |
| 5,212,826 | 5/1993 | Rabe et al. | 455/214 |

OTHER PUBLICATIONS

"Integrating An MR Head Into A Peak Detection Channel", Nathan Curland and Russell J. Machelski.

*Primary Examiner*—Aristotelis Psitos
*Assistant Examiner*—Patrick Wamsley
*Attorney, Agent, or Firm*—Kinney & Lange

[57] ABSTRACT

A DC offset voltage is added to the analog timing signal in a peak detection data recovery circuit to cancel the timing asymmetry from a magnetoresistive head signal. An AC timing asymmetry cancellation circuit uses a charge pump, buffer amplifier and resistor divider to produce the proper DC offset voltage automatically.

15 Claims, 5 Drawing Sheets

Fig. 5

AC TIMING ASYMMETRY REDUCTION CIRCUIT INCLUDING SUMMING DC OFFSET VOLTAGE WITH TIMING SIGNAL

BACKGROUND OF THE INVENTION

The present invention relates to, but is not limited to, magnetoresistive (MR) heads that read magnetically encoded information. In particular, the present invention relates to a peak detection timing circuit modification which improves the error rate in recovered data, as a result of compensating for AC timing asymmetry in the timing signal which may be especially prevalent in MR heads.

Magnetoresistive heads are used to read back magnetically encoded information from thin films of magnetic media on rigid disc substrates. The error rate is a measure of the accuracy with which the encoded data is recovered and converted back to the original digital information. Head, preamplifier, media, and radiated interference noises, intersymbol (pattern dependent) interference, overwrite, and AC timing asymmetry are known loss mechanisms that contribute to a large error rate. Timing asymmetry (whether AC or DC) is often termed "pulse pairing".

AC timing asymmetry is defined for single frequency signals that are written over a much higher frequency signal (or over AC erased media). AC timing asymmetry is characterized by the timing difference that exists between each pulse and its expected location, which is exactly half way between its two neighboring pulses.

Constant (DC) magnetic fields from remanence in the magnetic write head, or from external sources, can cause AC timing asymmetry in any digital magnetic recording system, as can asymmetry in the write current waveform, which results from electronic offsets, non-linearities, or leakage current. Data recovery systems that derive timing information by performing a zero crossing comparison on the differentiated, filtered readback signal are susceptible to additional AC timing asymmetry as a result of a DC offset voltage at the input of this timing comparator.

Present digital magnetic recording systems that use inductive transducers to read signals are not particularly impacted by these sources of AC timing asymmetry because it is possible to mass produce systems in which all of these effects are small. Also, a high probability exists for some asymmetry effects to cancel others.

Signals are transduced with MR heads because the resistance of the MR element varies as a function of the angle between the magnetization vector in the element (M) and the electrical current flowing through the element (I). The MR element is designed to be magnetically permeable, so M is rotated, relative to its quiescent direction, by the unshielded fields that emanate from magnetic transitions in the moving media.

The fundamental MR effect has been characterized to have a cosine squared dependence on the angle between the I and M vectors. Therefore, the MR element resistance change is most rapid, and most linear, as M rotates through a 45 degree angle with respect to I (bias angle) and the MR element resistance change is very slow, and non-linear, as M approaches a zero or a 90 degree bias angle.

An MR element that operates around a quiescent bias angle of 45 degrees will have a symmetric and linear response to small rotations of M. The same element will have a very non-linear response to large M rotations, but will maintain a symmetric response. This symmetry is lost, especially for large rotations, as the quiescent bias angle shifts away from 45 degrees. The element then transduces a much more compressed pulse for one signal polarity as compared to the opposite polarity.

Transitions are written in thin longitudinal media by switching the polarity of the write field component that is applied along the axis of media motion (or at some relative skew angle). A transverse write field fringes from both sides of the write head and coincidentally writes transverse transitions. This is often referred to as "side writing".

To maximize signal-to-noise ratio, for a given system write-to-read mis-registration characterization, rigid disc applications use MR read element designs which read nearly as wide as the integral write heads write. Therefore, a summation of the fields from transverse, side written, transitions and from primary signal transitions are responsible for rotating M to produce a readback signal.

The resulting readback signal possesses a "baseline shift" characteristic, which varies as a function of write-to-read mis-registration. Baseline shift is most easily observed when reading back relatively isolated transitions. It appears as a band limited squared wave, which skews each pulse as it switches polarity approximately coincident with each pulse. It then holds the signal at a non-zero level, until the next pulse, of the opposite polarity, is encountered.

MR elements that are not biased symmetrically, as described above, will transduce signals in which the more compressed pulse is not affected as much (especially in terms of pulse skew) as the opposite (larger amplitude) pulse. This results in AC timing asymmetry, which varies as a function of write-to-read mis-registration. Accordingly, the preferred embodiment of the present invention is adaptive.

If either the I or the M vectors are not uniform across the element (barber pole biasing is a good example of non-uniform I) then a non-planar write gap will result in still another AC timing asymmetry term. A stepped write gap is common because the writer is deposited on top of the contour formed by the MR contacts, which are patterned to form the reading portion of the MR element. However, additional processing steps are capable of significantly diminishing the magnitude of these write gap steps. If a stepped write gap and non-uniform MR element biasing coexist, then two signals of different amplitude symmetry will be transduced at two slightly different times to form a composite waveform. This composite waveform will possess AC timing asymmetry that varies as a function of write-to-read mis-registration.

When reading magnetic signals with MR heads, significant additional AC timing asymmetry may exist, which has been observed to degrade error rate performance by as much as 2 decades (a factor of 100).

SUMMARY OF THE INVENTION

In the present invention, an external DC offset voltage is deliberately applied at the timing comparator input to introduce an AC timing asymmetry term which cancels approximately half of the maximum AC timing asymmetry in the timing signal. The present invention has been shown to improve the timing channel error rate by as much as 1 decade (a factor of 10).

The largest error rate improvement is realized when approximately half of the maximum asymmetry is canceled because the data recovery filter bandwidth is narrow enough to significantly reduce the AC timing asymmetry from the highest code frequency. Therefore, as the DC offset voltage is increased to cancel more than half of the AC timing asymmetry for all other frequencies, a similar amount of detrimental AC timing asymmetry is returned to data patterns that include the highest code frequency.

Accordingly, the preferred embodiment of the present invention uses closed loop control to create a DC offset voltage which cancels all AC timing asymmetry from a medium frequency synchronization signal, and then shunts away approximately half of this voltage during data recovery operations.

DETAILED DESCRIPTION OF THE PREFERRED EMBODIMENTS

Figure 1:
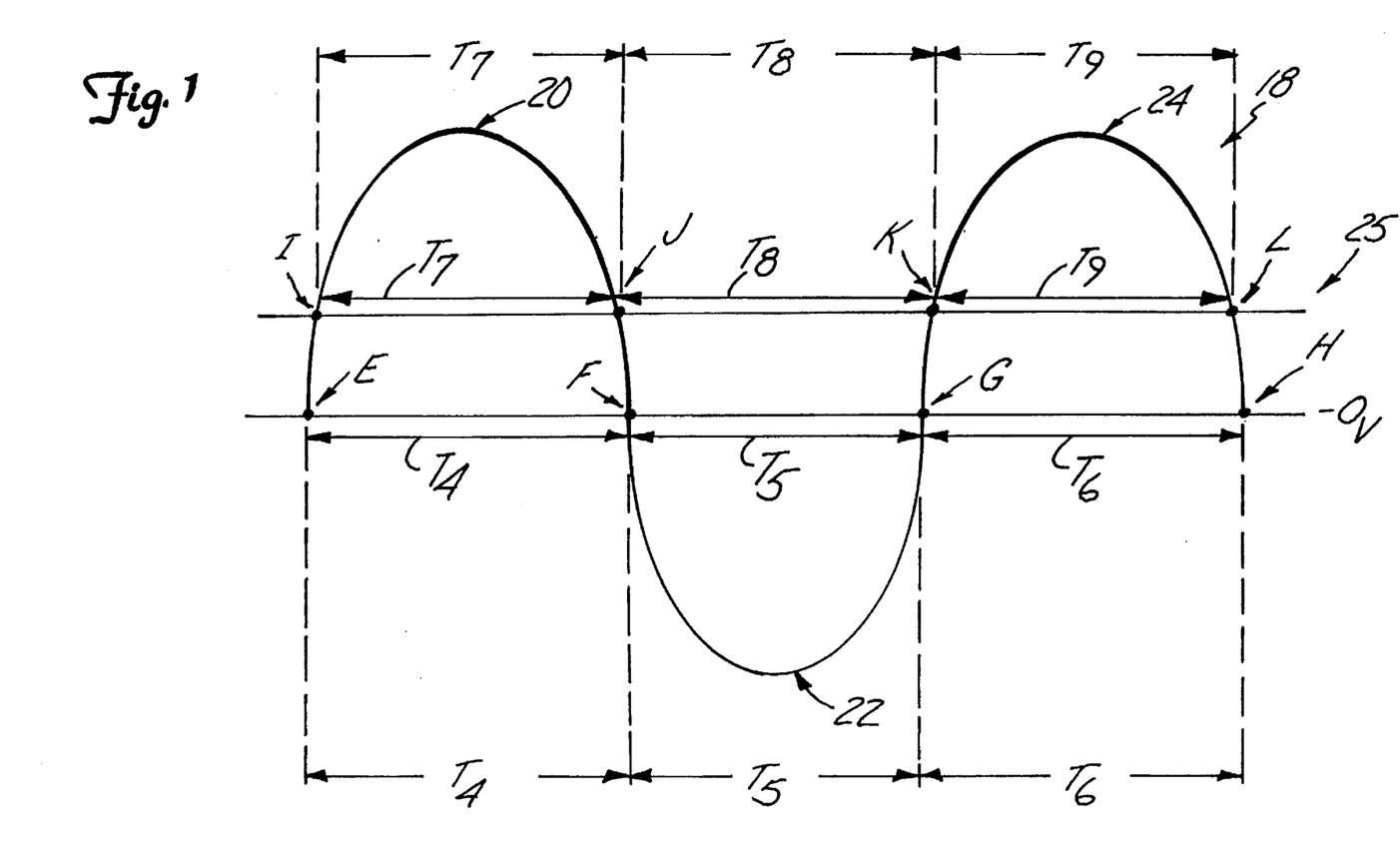
FIG. 1 shows a differentiated read signal exhibiting the effects of AC timing asymmetry.

FIG. 1 shows differentiated read signal 18. Signal 18 is shown on a zero voltage baseline with peaks 20, 22, and 24. Also shown are zero crossing points E, F, G, and H. Zero crossing points E–H represent detected transitions from the data written on a magnetic media disc (not shown). The polarity of the transition represented by each zero crossing is indicated by the polarity of the slope of read signal 18 at each zero crossing.

As shown, read signal 18 has no noticeable timing asymmetry. This can be seen from the fact that time interval $T_4$ is approximately equal to time interval $T_5$ which is approximately equal to time interval $T_6$. DC signal 25 illustrates where the effective "zero crossing" level would be, relative to read signal 18, if a negative DC voltage were added to read signal 18. New zero crossing points (I,J,K,L) would replace the original points (E,F,G,H), which would define relative time intervals $T_7$, $T_8$, and $T_9$, rather than time intervals $T_4$, $T_5$, and $T_6$. With the DC voltage added, read signal 18 possesses timing asymmetry, because time intervals $T_7$ and $T_9$ are noticeably shorter than time interval $T_8$.

Figure 2:
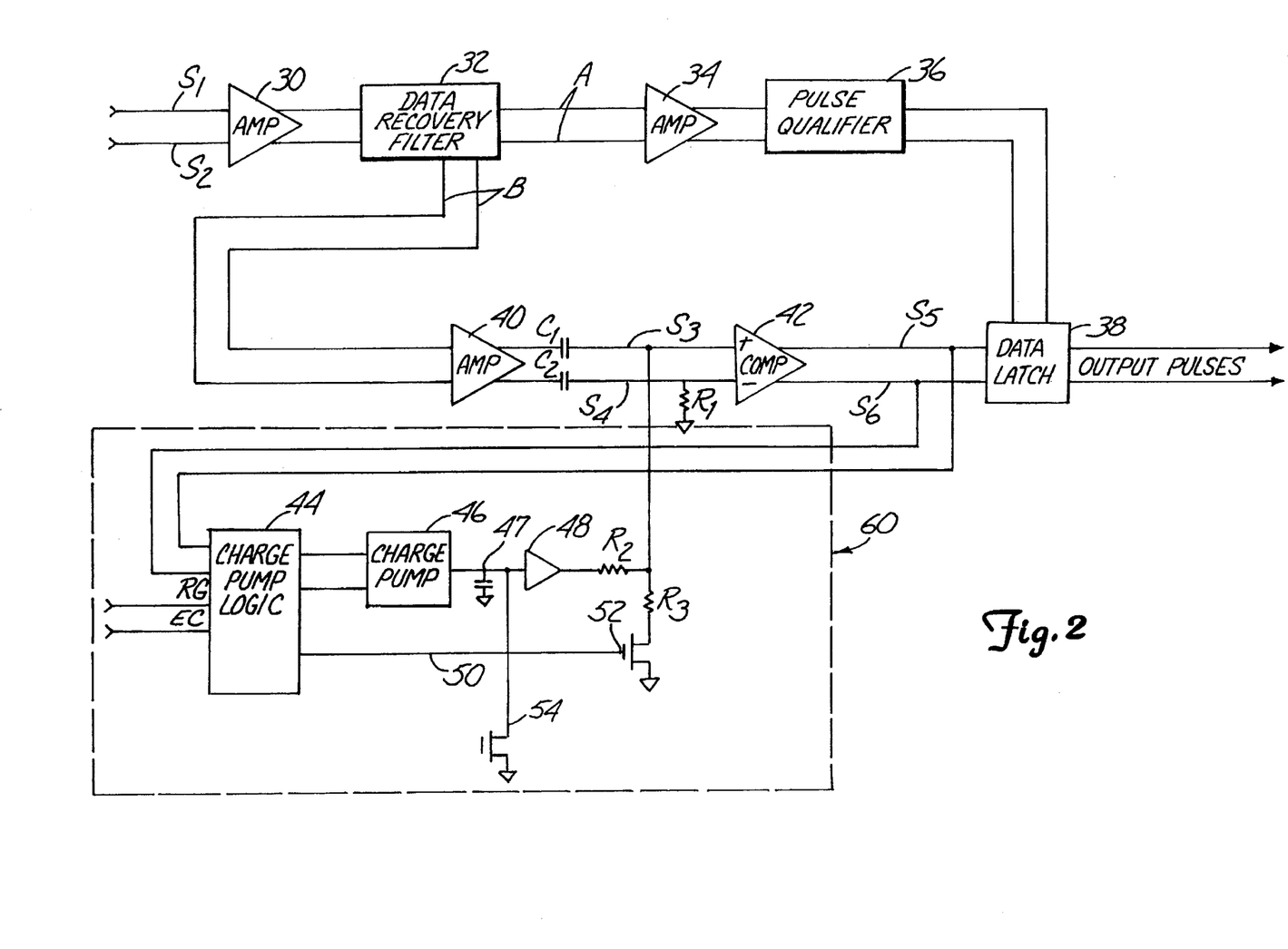
FIG. 2 shows a schematic of a preferred embodiment of the present invention.

FIG. 2 shows, in block diagram form, a preferred embodiment of the present invention. Differential analog signals $S_1$ and $S_2$ represent transitions detected from a magnetic media disc (not shown). Signals $S_1$ and $S_2$ are amplified by amplifier 30, which drives data recovery filter 32. Data recovery filter 32 produces two outputs. Qualification signal A is a "slimmed" and low-pass filtered version of the analog signal $S_1$–$S_2$. Signal A is amplified by amplifier 34 which drives pulse qualifier 36. Pulse qualifier 36 is a threshold type qualifier, which provides positive enable pulses whenever signal A rises above 50% of its recent average positive peak amplitude, and provides negative enable pulses whenever signal A falls below 50% of its average negative peak amplitude. Each enable pulse causes data latch circuit 38 to produce an output pulse at the next timing signal transition of the appropriate polarity.

Signal B of data recovery filter 32 is a differentiated (band pass filtered) version of signal A, such that each (qualified) zero crossing of output B represents a transition that has been detected from a rigid magnetic media disc (not shown).

Signal B is amplified by amplifier 40 and AC coupled to comparator 42 by large capacitors $C_1$ and $C_2$. A DC bias voltage of zero is applied to the negative comparator input through resistor $R_1$. An adjustable DC bias voltage is applied to the positive comparator input by timing asymmetry cancellation circuit 60. Therefore, analog timing signal S4 is applied to comparator 42 with zero DC voltage added, whereas its differential counterpart S3 is applied to comparator 42 with a compensating DC voltage added, in accordance with the present invention.

During synchronization, comparator output signals $S_5$ and $S_6$ are complimentary 4T digital logic signals (having a duration of four encoder clock periods between each transition). A 4T pattern is commonly used in the synchronization (sync) portion of each sector in rigid disc drives. A 3T pattern is actually the best sync pattern to use in conjunction with the present invention when applying a 1,7 RLL encoding scheme. However, the use of a 4T pattern is described because it is desirable to maintain compatibility with present systems. Signal $S_5$ is outputted from comparator 42 and is fed back to charge pump logic circuit 44.

Read gate RG is defined as a system control logic signal that becomes active for each sector read operation at the beginning of each 4T sync pattern. Read gate RG is reset as each sector read operation is completed. Charge pump logic circuit 44 uses read gate RG to initiate a burst of 16 (or other number) charge pump cycles, which are generated by encoder clock EC and differential timing signals $S_5$ and $S_6$ by using several D-flip-flop elements (not shown).

Each charge pump cycle is characterized by one narrow pump up signal pulse (ranging in width from 0 to T) and one narrow pump down signal pulse occurring approximately four (4) encoder clock periods later. Charge pump logic circuit 44 is designed to produce narrow pump up and pump down pulses because charge pump 46 acts to switch current into filter capacitor 47 when the pump up signal is active, and to drain a matched current out of the same filter capacitor when the pump down signal is active.

It is difficult to obtain precise current matching, especially over product operating temperature extremes. Using narrow pump up and pump down pulses minimizes charge pump 46 output voltage contributions resulting from unequal sourcing and sinking currents. Ideally, the filtered charge pump 46 output voltage will change in response to each pump up/down pulse pair, and this change will be proportional to the width difference between the pump up and pump down signals. Obviously any other current sources that influence the charge pump 46 output will defeat its operation.

Therefore proper operation of charge pump 46 requires the use of high input impedance, low input bias current buffer amplifier 48, which does not load the charge pump 46 output much at its input but provides an identical voltage at its output capable of driving resistor divider, $R_2$ and $R_3$ to supply the compensating DC offset voltage to timing channel comparator 42 in order to dose the loop.

Thus, for each charge pump cycle, pump up and pump down signals are produced by charge pump logic circuit 44 such that the output voltage of the receiving charge pump 46 changes in proportion to the timing asymmetry of each 4T timing signal period during the 4T sync pattern. The accumulated charge pump 46 output voltage is buffered by a high impedance buffer amplifier 48 which presents an identical voltage to the input of the timing channel comparator 42 through resistor $R_2$. This DC voltage is added to analog timing signal $S_3$ which acts to incrementally cancel the average 4T timing signal timing asymmetry.

When all 16 charge pump cycles have occurred, the accumulated DC offset voltage at timing comparator input 42 is held at a value that results in approximate cancellation of the average timing asymmetry of a 4T pattern. At this time, disable charge pump signal 50 becomes active and turns on switch 52 that allows current to flow through shunt resistor $R_3$ (of the resistor divider) connected to timing channel comparator 42 input. This divides the DC offset voltage in half, (or whatever is determined to be optimum) so that about half of the timing asymmetry of the 4T timing signal is canceled while reading the data portion of each sector.

Each successive sector read from the same track will provide another 16 charge pump cycles and will further improve the accuracy of the compensating DC offset voltage. However, the necessary compensation is expected to vary in magnitude and polarity for different track locations and especially for different head selections. Given these changing conditions, the compensating DC offset voltage accuracy will be best, on average, if the charge pump output voltage is reset to zero prior to each initial sector read operation. This is accomplished by charge pump reset switch 54 which is turned on during each seek or head select operation. The adaptive scheme presented in the preferred embodiment of the present invention minimizes the timing channel error rate in peak detection systems with respect to AC timing asymmetry loss terms.

Figure 3:
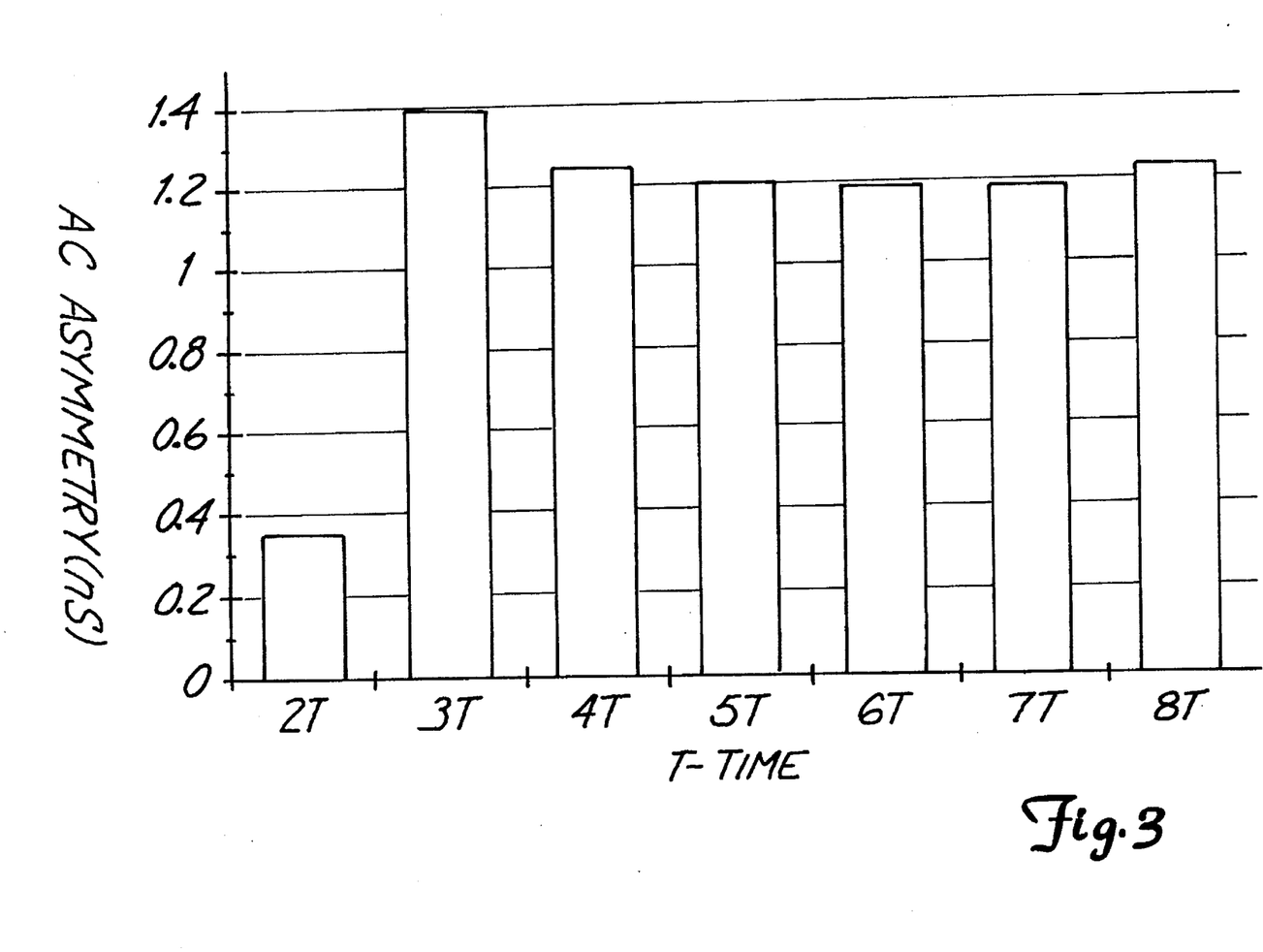
FIG. 3 shows AC asymmetry for various encoder clock periods.

FIG. 3 shows a plot labeled AC asymmetry vs. T-Time. Horizontal axis, "T-Time" represents various single frequency signals having transition spacings, as labeled, in encoder clock periods. Vertical axis, "AC asymmetry" represents the average relative timing difference which exists between each pulse and its expected location. When using a 1,7 RLL code, a 3T pattern typically exhibits the largest AC timing asymmetry and a 2T pattern exhibits a relatively small AC timing asymmetry. All other allowed frequencies (4T through 8T) exhibit nearly as much AC timing asymmetry as the 3T pattern.

Figure 4:
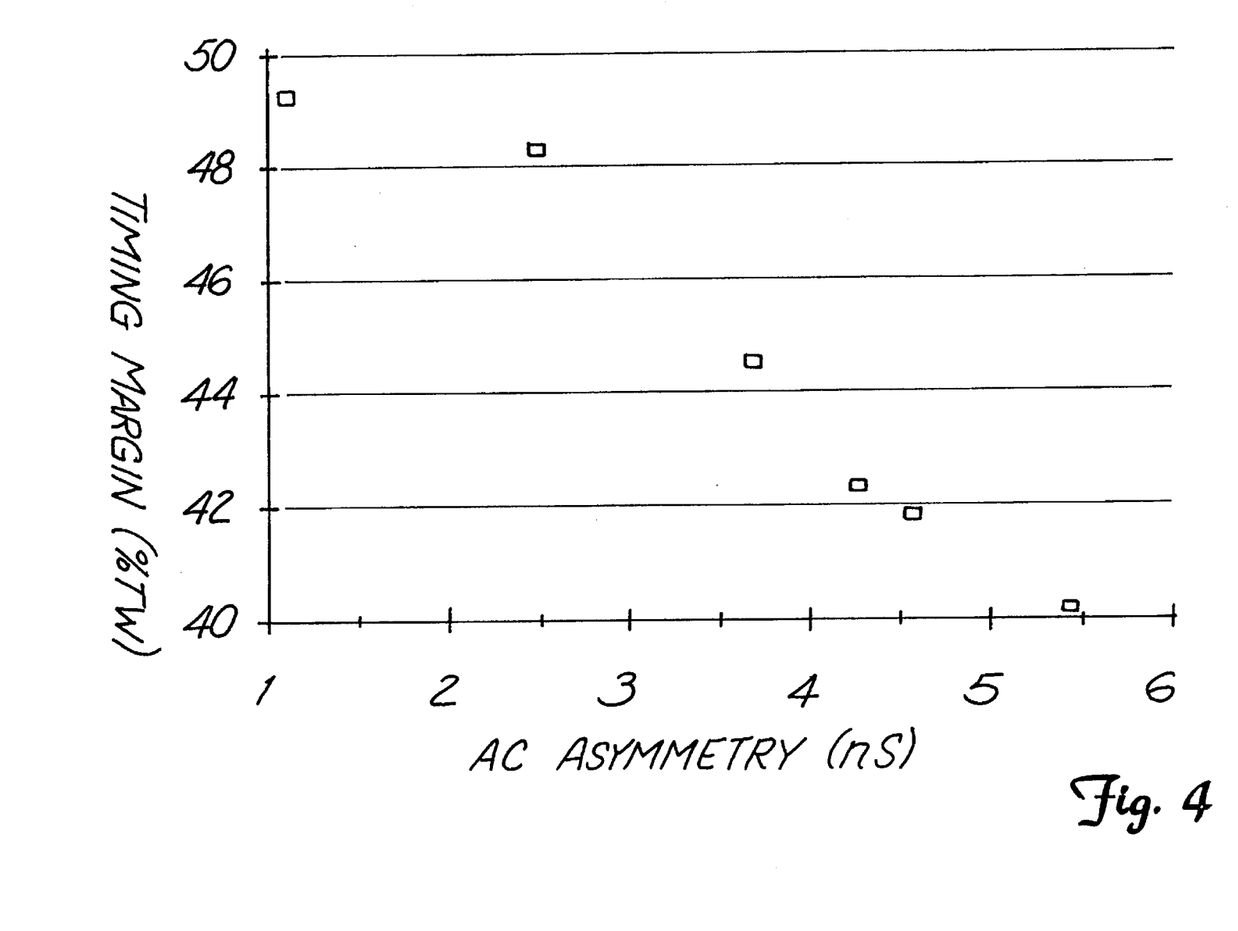
FIG. 4 shows a plot of low frequency timing margin vs. AC asymmetry.

FIG. 4 shows a plot of low frequency timing margin vs. AC asymmetry. Note that an MR head different from that which was used to obtain the data for FIG. 3 is used in FIG. 4. Horizontal axis, "AC asymmetry" represents the average relative timing difference that exists between each detected 8T pulse and its expected location (in nanoseconds). This 8T AC timing asymmetry was varied by adding a DC offset voltage to the timing channel comparator input in accordance with the present invention. Vertical axis, "timing margin" (expressed as a percentage of the timing window) is a measurement of the additional timing error that could be introduced, normalized to the largest allowable timing error of T/2, such that the specified bit error rate (BER) is still achieved (BER=1E-10, in this case). As the AC asymmetry loss term is canceled, more timing margin is available to accommodate other losses, such as component variations or positioning errors. In FIG. 4, a timing margin improvement of 9% Tw (percent of timing window) is achieved by canceling essentially all of the AC timing asymmetry in the 8T MR head signal. This would improve 8T BER by about 2 decades.

Figure 5:
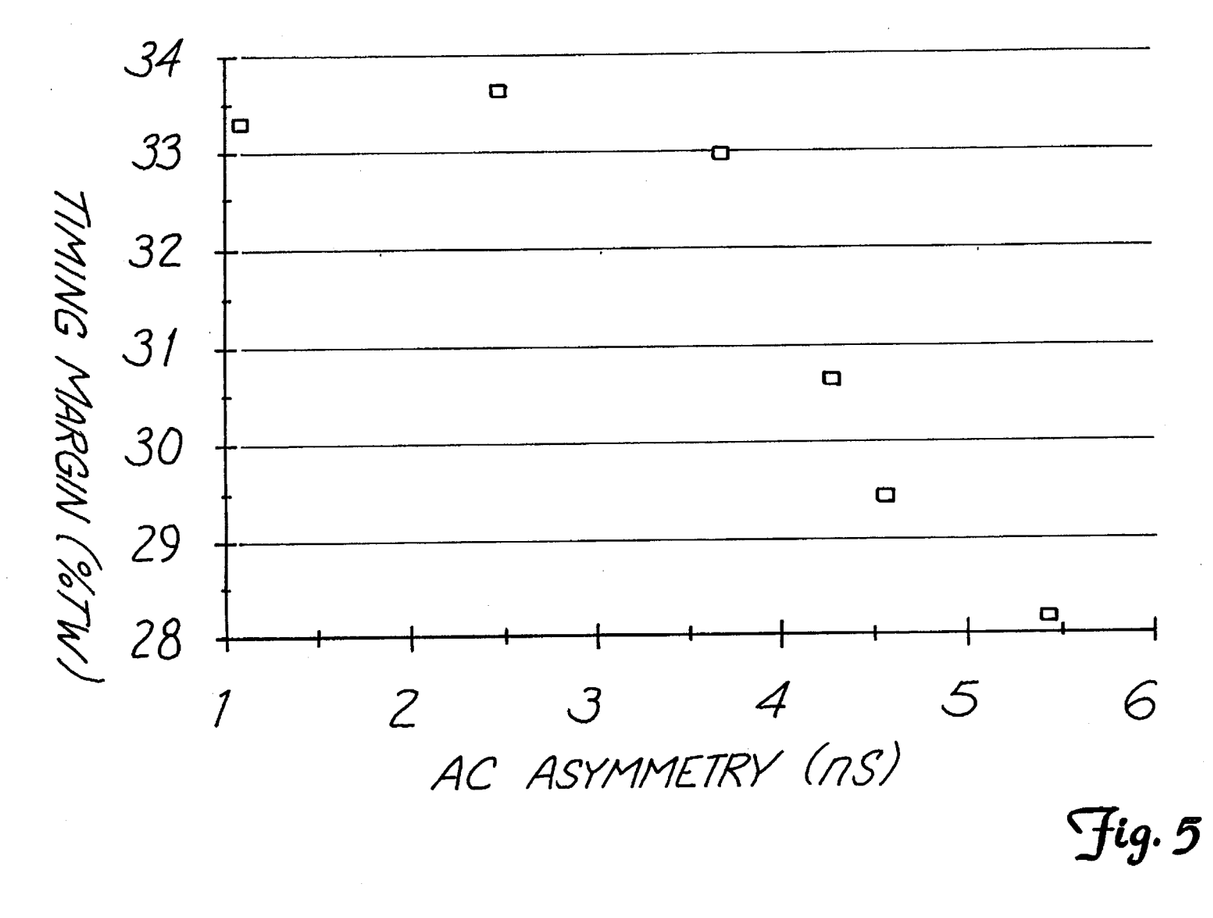
FIG. 5 shows a plot of random timing margin vs. AC asymmetry.

FIG. 5 shows a random data timing margin vs. AC asymmetry graph. In this case, the same DC offsets were applied, and the same MR head and disc were used. However, as more than half of the 8T AC timing asymmetry was canceled, no further timing margin was realized. Instead, the random data timing margin of the same MR head and disc could only be improved by 5.5% Tw, which was accomplished by canceling approximately half of the 8T AC timing asymmetry.

Substantial error rate improvement can be realized with the present invention. Specifically, when an external DC offset voltage is applied to a timing comparator input, an AC timing asymmetry term which cancels approximately half of the maximum AC timing asymmetry in the analog timing signal is produced. The invention is adaptive in order to maintain cancellation of slow variations of AC timing asymmetry and to eliminate costly adjustments in each read head circuit.

Although the present invention has been described with reference to preferred embodiments, workers skilled in the art will recognize that changes may be made to form and detail without departing from the spirit and scope of the invention.

What is claimed is:

1. In a data recovery system which reads data from a magnetic medium and which derives timing information from a comparator, a method to compensate for AC timing asymmetry comprising:

detecting data transitions in the form of timing signals;

iteratively accumulating an approximate DC offset voltage based on timing asymmetry in the timing signal, the approximate DC offset voltage of successive iterations converging on an accurate offset voltage;

dividing the approximate DC offset voltage;

controlling the DC offset voltage division by predetermined switching of the approximate DC offset voltage between an active and an inactive state; and summing the divided DC offset voltage and the timing signal.

2. The method of claim 1 wherein the DC offset is generated using charge pump cycles derived from a timing signal and an encoder clock signal.

3. The method of claim 2 wherein the DC offset voltage generated by a timing asymmetry cancellation circuit results in cancellation of timing asymmetry in a 4T timing signal.

4. The method of claim 2 wherein the DC offset voltage generated by the timing asymmetry in a 3T timing signal.

5. The method of claim 2 wherein the DC offset voltage division is inactive during the charge pump cycles and is active during reading of user data.

6. In a data recovery system which reads data from a medium and which derives timing information from the medium, an apparatus for compensating for AC timing asymmetry, comprising:

means for generating a timing signal based on timing of data read from the magnetic medium;

DC offset voltage generator means for iteratively generating and accumulating an approximate DC offset voltage based on timing asymmetry contained in a timing signal, the approximate DC offset voltage of successive iterations converging on an accurate offset voltage;

dividing means for dividing the approximate DC offset voltage to obtain a divided DC Offset voltage;

switching means for controlling the dividing means by predetermined switching of the approximate DC offset voltage between an active and an inactive state; and summing means for summing the divided DC offset voltage and the timing signal.

7. The data recovery system of claim 6 wherein the DC offset generator means comprises a charge pump circuit.

8. In a data recovery system which reads data from a magnetic medium and which derives timing information from a comparator, an apparatus to compensate for AC timing asymmetry comprising:

a charge pump logic circuit to receive a timing signal and to produce a charge pump cycle characterized by a pump up and a pump down signal, the charge pump logic circuit including a read gate to initiate a burst of multiple charge pump cycles;

a capacitor;

a charge pump which acts to charge the capacitor when the pump up signal is active and to drain the capacitor when the pump down signal is active; and summing means for summing the capacitor charge and the timing signal.

9. The data recovery system of claim 8 wherein a discharge switch is connected to the capacitor.

10. The data recovery system of claim 9 wherein the discharge switch is used to discharge the capacitor during a head selection operation.

11. The data recovery system of claim 9 wherein the discharge switch is used to discharge the capacitor during a seek operation.

12. In a data recovery system which reads data from a magnetic medium and which derives timing information from the medium, an apparatus for compensating for AC timing asymmetry comprising:

means for operating a charge pump logic circuit wherein the circuit is responsive to positive asymmetry in a timing signal to generate a pump up signal and is responsive to negative asymmetry in the timing signal to generate a pump down signal, the charge pump logic circuit including a read gate to initiate a burst of multiple charge pump cycles;

DC offset voltage generator means responsive to the pump up and pump down signals for iteratively, generating and accumulating an approximate DC offset voltage based on based on successive bursts of cycles of pump up and pump down signal; and means for summing the approximate DC offset voltage and the timing signal.

13. In a data recovery system which reads data from a first sector of a first track of a magnetic disc, a method of compensating for AC timing asymmetry in a data timing signal, the method comprising:

iteratively deriving and accumulating an approximate DC offset-canceling voltage according to an AC timing asymmetry, the approximate DC offset voltage of successive iterations converging on an accurate offset voltage;

summing the approximate DC offset-canceling voltage and the timing signal; and dividing the approximate offset-canceling voltage after a predetermined number of iterations.

14. The method of claim 13 further comprising resetting the offset-canceling voltage to zero.

15. The method of claim 14 wherein resetting occurs before reading from a second sector of the first track of the magnetic disc.

* * * * *

UNITED STATES PATENT AND TRADEMARK OFFICE
CERTIFICATE OF CORRECTION

PATENT NO. : 5,469,305

DATED : November 21, 1995

INVENTOR(S) : TIMOTHY A. MADSEN; RUSSELL J. MACHELSKI

It is certified that error appears in the above-indentified patent and that said Letters Patent is hereby corrected as shown below:

Col. 4, line 55, after "in order to", delete "dose", insert --close--

Col. 6, line 56, delete "Offset", insert --offset--

Col. 8, line 5, after "based on", delete second "based on"

Signed and Sealed this

Twenty-sixth Day of March, 1996

Attest:

BRUCE LEHMAN

Attesting Officer        Commissioner of Patents and Trademarks